United States Patent
Odagiri et al.

(10) Patent No.: US 8,741,065 B2
(45) Date of Patent: *Jun. 3, 2014

(54) SUBSTRATE PROCESSING APPARATUS

(75) Inventors: Masaya Odagiri, Nirasaki (JP); Yusuke Muraki, Nirasaki (JP); Jin Fujihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

This patent is subject to a terminal disclaimer.

(21) Appl. No.: 13/172,366

(22) Filed: Jun. 29, 2011

(65) Prior Publication Data

US 2012/0000629 A1 Jan. 5, 2012

(30) Foreign Application Priority Data

Jun. 30, 2010 (JP) ................... 2010-149656

(51) Int. Cl.
*C23F 1/00* (2006.01)
*H01L 21/306* (2006.01)
*C23C 16/00* (2006.01)
*C23C 16/50* (2006.01)

(52) U.S. Cl.
USPC ...... 118/728; 118/715; 118/724; 156/345.51; 156/345.53

(58) Field of Classification Search
USPC ................ 118/728–733; 156/345.51–345.55
See application file for complete search history.

(56) References Cited

U.S. PATENT DOCUMENTS

| 2005/0051098 | A1 | 3/2005 | Aramaki et al. |
| 2007/0207014 | A1 | 9/2007 | Toshima |
| 2010/0024981 | A1* | 2/2010 | Wallace et al. .......... 156/345.27 |

FOREIGN PATENT DOCUMENTS

JP 9-017770 A 1/1997

* cited by examiner

*Primary Examiner* — Maureen Gramaglia
*Assistant Examiner* — Tiffany Nuckols
(74) *Attorney, Agent, or Firm* — Nath, Goldberg & Meyer; Jerald L. Meyer

(57) ABSTRACT

A substrate processing apparatus includes a substrate stage for mounting two or more substrates thereon. The substrate stage includes substrate stage units. Each of the substrate stage units includes a central temperature control flow path for controlling the temperature of a central portion of each of the substrates and a peripheral temperature control flow path for controlling the temperature of a peripheral portion of each of the substrates. The central temperature control flow path and the peripheral temperature control flow path are formed independently of each other. The substrate stage includes one temperature control medium inlet port for introducing therethrough a temperature control medium into the peripheral temperature control flow path and temperature control medium outlet ports for discharging therethrough the temperature control medium from the peripheral temperature control flow path. The number of the temperature control medium outlet ports corresponds to the number of substrates.

9 Claims, 5 Drawing Sheets

SUBSTRATE PROCESSING APPARATUS

CROSS-REFERENCE TO RELATED APPLICATIONS

This application is based upon and claims the benefit of priority from Japanese Patent Application No. 2010-149656, filed on Jun. 30, 2010, the entire contents of which are incorporated herein by reference.

TECHNICAL FIELD

The present disclosure relates to a substrate processing apparatus for use in a fine processing field, e.g., in a semiconductor manufacturing process.

BACKGROUND

When processing a substrate (wafer) in a semiconductor manufacturing process in a vacuum condition, temperature is controlled to make the surface temperature of the substrate uniform and to enhance processing uniformity. Temperature may be controlled by forming a coolant flow path within a substrate stage for mounting a substrate, allowing a coolant to flow through the flow path and cooling the surface of the substrate mounted on the substrate stage with radiant heat radiating from the substrate stage.

For example, Japanese Laid-Open Patent Publication No. (Hei) P9-17770 (hereinafter, JP9-17770A) discloses a plasma processing apparatus in which two concentric coolant flow paths are formed within a substrate stage. The temperature of the coolant flowing through the outer flow path differs from that of the coolant flowing through the inner flow path. Thus, the peripheral portion of a substrate exposed to radiant heat radiating from the inner wall of a chamber is cooled more heavily than the central portion of the substrate, thereby making the surface temperature of the substrate uniform.

In the plasma processing apparatus disclosed in JP9-17770A, however, the two coolant flow paths, through which coolants differing in temperature flow, are arranged adjacent to each other within one substrate stage. Thus, the temperatures of the two coolant flow paths affect each other, and there is a concern that the cooling operations of the central portion and the peripheral portion of the substrate cannot be independently controlled. In other words, it becomes impossible to precisely manage and control the temperatures of the central portion and the peripheral portion of the substrate mounted on the substrate stage. This makes it difficult to have the temperature of the substrate uniform over the entire surface since the temperature of the peripheral portion of the substrate is greatly influenced by the radiant heat radiating from the inner wall of a chamber while the temperature of the central portion of the substrate is less affected by the radiant heat. Thus, since the conditions of the entire surface of the substrate are not kept uniform when processing the substrate, there is a problem that the substrate cannot be processed uniformly. The integral formation of the substrate stage within the plasma processing apparatus is also the reason why the temperatures of the two coolant flow paths have an influence on each other and the temperatures of the central portion and the peripheral portion of the substrate cannot be independently controlled. Further, since the two coolant flow paths are provided independently, coolant supply and discharge pipes are required for the inlet ports and the outlet ports of the respective coolant flow path, which poses a problem that the number of pipes required in the plasma processing apparatus is increased and the piping arrangement becomes complicated.

In the plasma processing apparatus disclosed in, e.g., JP9-17770A, the substrate is usually held on the substrate stage by an electrostatic chucking method or the like. Thus, a temperature change in the substrate stage tends to directly cause a temperature change in the substrate surface. This makes it fairly easy to manage and control the temperature of the substrate surface. In contrast, in a substrate processing apparatus of the type in which a substrate is held on a substrate stage with a gap left between the substrate and the substrate stage, the temperature of the substrate surface is managed and controlled by radiant heat radiating from the substrate stage. In this case, a temperature change in the substrate stage does not directly lead to a temperature change in the substrate surface. Accordingly, there is a need to more precisely manage and control the temperature of the substrate stage.

SUMMARY

The present disclosure provides some embodiments of a substrate processing apparatus capable of independently and precisely managing and controlling the temperatures of peripheral and central portions of a substrate with no mutual influence of the temperatures and capable of simplifying a piping arrangement.

According to one embodiment of the present disclosure, there is provided a substrate processing apparatus for processing substrates within a vacuum processing space, including: a substrate stage configured to mount at least two substrates thereon, the substrate stage including substrate stage units whose number corresponds to the number of the substrates mounted on the substrate stage, each of the substrate stage units including a central temperature control flow path for controlling the temperature of a central portion of each of the substrates and a peripheral temperature control flow path for controlling the temperature of a peripheral portion of each of the substrates, the central temperature control flow path and the peripheral temperature control flow path being formed independently of each other, the substrate stage including one temperature control medium inlet port for introducing therethrough a temperature control medium into the peripheral temperature control flow path and temperature control medium outlet ports for discharging therethrough the temperature control medium from the peripheral temperature control flow path, the number of the temperature control medium outlet ports corresponding to the number of the substrates mounted on the substrate stage. The term "temperature control" used herein refers to control and regulation of a temperature.

In other embodiments of the substrate processing apparatus, the peripheral temperature control flow path may include a peripheral inner flow path connected at one end to the temperature control medium inlet port and arranged to extend along the peripheral portion of each of the substrates, a peripheral outer flow path connected at one end to each of the temperature control medium outlet ports and arranged to extend along the peripheral portion of each of the substrates, and a connection flow path arranged to interconnect the other end of the peripheral inner flow path and the other end of the peripheral outer flow path, the connection flow path and each of the temperature control medium outlet ports being arranged adjacent to the temperature control medium inlet port to interpose the temperature control medium inlet port therebetween.

The central temperature control flow path and the peripheral temperature control flow path may be respectively connected to different temperature control medium sources. The central temperature control flow path and the peripheral temperature control flow path may each include a ceiling surface and a fin protruding from the ceiling surface. Flow control devices may be respectively provided in the temperature control medium outlet ports. The flow control devices may be controlled independently of each other.

In the substrate processing apparatus, each of the substrate stage units may include a peripheral stage member for mounting thereon the peripheral portion of each of the substrates to control the temperature of the peripheral portion, a central stage member for mounting thereon the central portion of each of the substrates to control the temperature of the central portion and a support base for supporting the peripheral stage member and the central stage member, the peripheral temperature control flow path being formed within the peripheral stage member, the central temperature control flow path being formed within the central stage member, the peripheral stage member and the central stage member not being in contact with each other with a gap left therebetween.

The peripheral stage member may include two or more annular peripheral stage portions and a peripheral stage connecting portion for coupling the peripheral stage portions, the central stage member including two or more central stage portions having a shape corresponding to inner circumferences of the peripheral stage portions and a central stage connecting portion for coupling the central stage portions, annular gaps being formed between the peripheral stage portions and the central stage portions in a horizontal direction, a gap being formed between the peripheral stage connecting portion and the central stage connecting portion in a vertical direction, the peripheral stage connecting portion and the central stage connecting portion being coupled to the support base. Focus rings that align the substrates in position may be provided in outer edges of the peripheral stage portions.

DETAILED DESCRIPTION

Figure 1:
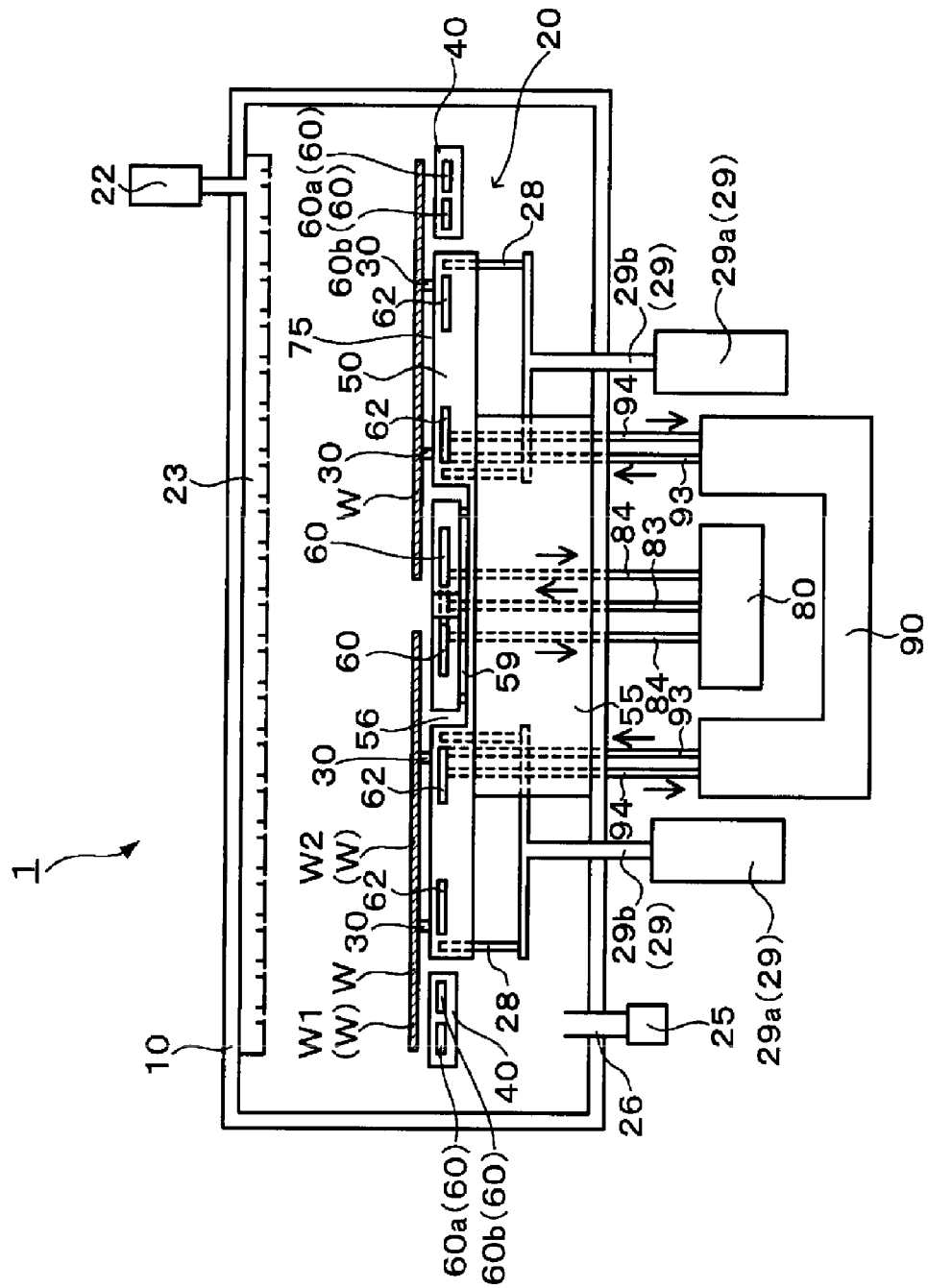
FIG. 1 is a schematic section view showing a substrate processing apparatus.

An embodiment of the present disclosure will now be described with reference to the drawings. In the specification and drawings of the subject application, elements substantially identical in function and configuration will be denoted by the same reference numerals and will not be described repeatedly. In the following description, a substrate processing apparatus 1 for simultaneously mounting and processing two substrates W will be taken as one example of the present embodiment.

FIG. 1 is a schematic section view showing a substrate processing apparatus 1 according to one embodiment of the present disclosure. As shown in FIG. 1, the substrate processing apparatus 1 includes a processing chamber 10 and a substrate stage 20 arranged within the processing chamber 10 to support substrates W when processing the substrates W. Further, FIG. 1 shows that two substrates W are mounted on the top surface of the substrate stage 20. The processing chamber 10 includes a process gas introduction portion 23 of, e.g., shower shape, in communication with a process gas supply device 22 and an exhaust port 26 remaining in communication with a vacuum pump 25. This makes it possible to vacuum the inside of the processing chamber 10. When processing the substrates W, a process gas is introduced into the processing chamber 10 from the process gas introduction portion 23.

A plurality of support pins 28 penetrating the substrate stage 20 and protruding above the substrate stage 20 to support the substrates W and mount the substrates W onto the substrate stage 20 is provided in the processing chamber 10. The support pins 28 are configured to be lifted up and lowered down by a lift device 29 which is connected to the support pins 28 to move the support pins 28 in a vertical direction (in an up-down direction in FIG. 1). As shown in FIG. 1, the lift device 29 includes a drive unit 29a, e.g., an air cylinder, provided outside the processing chamber 10, and a lift unit 29b connected to the drive unit 29a. The lift unit 29b extends from the drive unit 29a into the processing chamber 10. The support pins 28 are attached to the lift unit 29b and are moved up and down together with the lift unit 29b that moves up and down upon actuation of the drive unit 29a. When mounting the substrates W on the top surface of the substrate stage 20, the support pins 28 protrude above the substrate stage 20 by a specified distance. The substrates W are placed on the upper ends of the protruding support pins 28. In this state, the support pins 28 are lowered down so that the tip ends thereof can get closer to the top surface of the substrate stage 20, thereby mounting the substrates W onto the substrate stage 20.

Tiny projections 30 are formed on the top surface of the substrate stage 20. If the support pins 28 supporting the substrates W are lowered to be adjacent with the top surface of the substrate stage 20 as mentioned above, the substrates W are mounted on the substrate stage 20 so that they are spaced apart from the top surface of the substrate stage 20 by the projections 30 of the top surface of the substrate stage 20 (i.e., in a substantially contactless relationship with the substrate stage 20). In the substrate processing apparatus 1 of the present embodiment, three support pins 28 are provided with respect to one substrate W. Likewise, the projections 30 are formed at three points with respect to one substrate W. The substrate W is lifted up and lowered down so that it is supported at three points by the three support pins 28. The substrate W is mounted on the substrate stage 20 in a substantially contactless manner by the projections 30 formed at three points on the top surface of the substrate stage 20 (in a corresponding relationship with each of the substrates W). In this regard, the reason for mounting the substrates W on the top surface of the substrate stage 20 in a substantially contactless manner is that, if the substrates W are directly mounted on the substrate stage 20, impurities such as particles existing on the top surface of the substrate stage 20 may adhere to the surfaces of the substrates W.

Figure 2A:
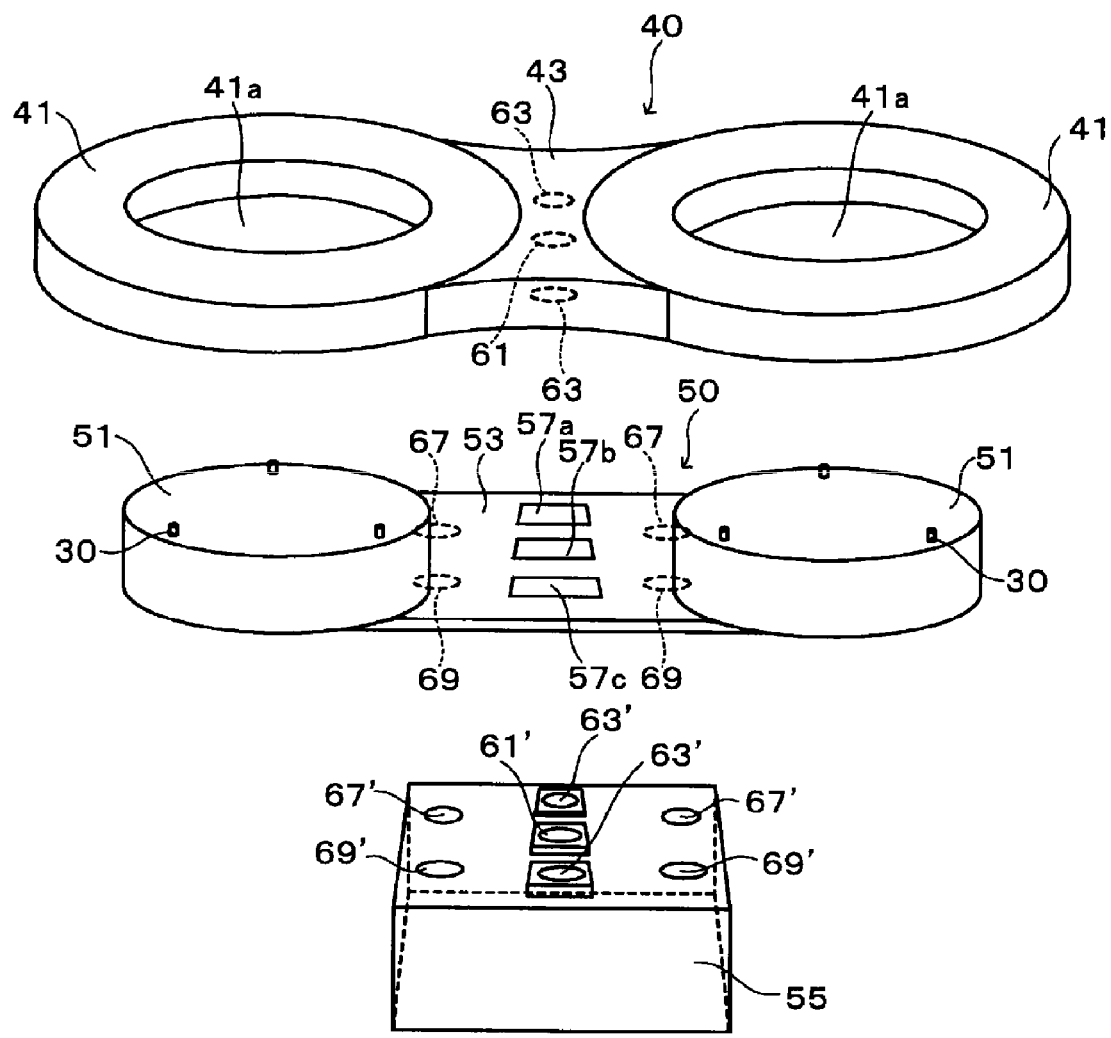
FIG. 2A is a front perspective view showing a substrate stage, the respective members (a peripheral stage member, a central stage member and a support base) of which are kept in a disassembled state.
Figure 2B:
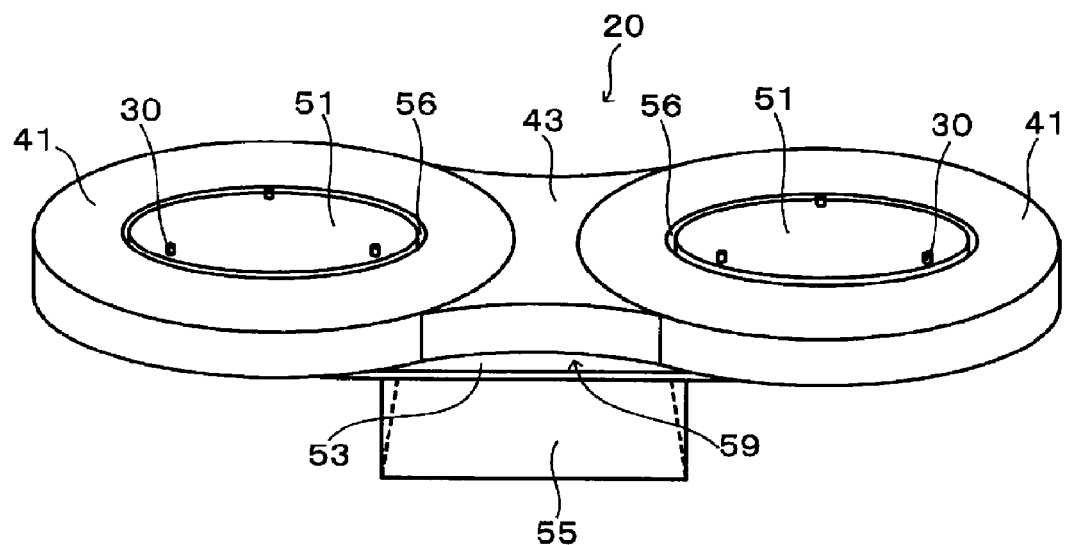
FIG. 2B is a front perspective view showing the substrate stage, the respective members of which are kept in an assembled state.

The configuration of the substrate stage 20 will now be described in detail with reference to FIGS. 2A and 2B that are explanatory views showing the substrate stage 20. FIG. 2A is a front perspective view showing the substrate stage 20, the respective members (a peripheral stage member 40, a central stage member 50 and a support base 55) of which are kept in a disassembled state. FIG. 2B is a front perspective view showing the substrate stage 20, the respective members of which are kept in an assembled state. The support pins 28 are provided to penetrate the substrate stage 20 and the respective temperature control flow paths to be described later are not shown in FIGS. 2A and 2B. The substrate stage 20 is arranged within the processing chamber 10 of the substrate processing apparatus 1 shown in FIG. 1 in a state that the respective members are assembled together as shown in FIG. 2A.

As shown in FIGS. 2A and 2B, the substrate stage 20 includes a peripheral stage member 40 for mounting thereon peripheral substrate portions W1 of the substrates W, a central stage member 50 for mounting thereon central substrate portions W2 of the substrates W and a support base 55 for supporting the peripheral stage member 40 and the central stage member 50. In the present embodiment, the peripheral stage member 40 and the central stage member 50 make up a substrate stage unit. The peripheral stage member 40 includes two generally-annular peripheral stage portions 41 and a peripheral stage connecting portion 43 for coupling the two peripheral stage portions 41 arranged side by side in the horizontal direction. The central stage member 50 includes two generally-disc-shaped central stage portions 51 and a central stage connecting portion 53 for coupling the central stage portions 51 arranged side by side in the horizontal direction. In this regard, the shape of the inner circumferences of the peripheral stage portions 41 corresponds to the shape of the central stage portions 51. In other words, the central stage portions 51 fit into the central spaces 41a of the generally-annular peripheral stage portions 41 when the peripheral stage member 40 and the central stage member 50 are superimposed as shown in FIG. 2B. Therefore, the plan-view (top surface) shape of the central spaces 41a is substantially the same as the plan-view (top surface) shape of the central stage portions 51. The area of the top surface of the central stage portions 51 is smaller than the area of the top surface of the central spaces 41a. The area of the top surface of the peripheral stage portions 41 is substantially equal to the area of the top surface of the central stage portions 51.

Since the shape of the peripheral stage portions 41 corresponds to the shape of the central stage portions 51 as mentioned above, annular gaps 56 are formed between the peripheral stage portions 41 and the central stage portions 51 in the horizontal direction when the peripheral stage member 40 and the central stage member 50 are superimposed as shown in FIG. 2B. In order to make up the substrate stage 20, the respective members (the peripheral stage member 40, the central stage member 50 and the support base 55) are coupled together by screws (not shown). Similarly, the central stage connecting portion 53 and the support base 55 are coupled together by screws (not shown). The coupling of the respective members is performed such that a gap 59 exists between the peripheral stage connecting portion 43 and the central stage connecting portion 53 in a vertical direction. As a result, the substrate stage 20 has a shape such that the peripheral stage member 40 and the central stage member 50 are kept out of contact with each other.

As shown in FIG. 2A, a temperature control medium inlet port 61 is provided at one point in the central area of the lower surface of the peripheral stage connecting portion 43. Through the temperature control medium inlet port 61, a temperature control medium, e.g., a coolant such as cooling water, is introduced into peripheral temperature control flow paths 60 formed within the peripheral stage member 40 (within the peripheral stage portions 41). Temperature control medium outlet ports 63 for discharging therethrough the coolant from the peripheral temperature control flow paths 60 are provided at two points on both sides (the front and rear sides in FIGS. 2A and 2B) of the temperature control medium inlet port 61. In this regard, the peripheral stage member 40 includes two peripheral stage portions 41 for mounting two substrates thereon and one peripheral stage connecting portion 43. The peripheral temperature control flow paths 60 are respectively formed within the two peripheral stage portions 41. The peripheral temperature control flow paths 60 come into communication with each other in the temperature control medium inlet port 61. The configuration and shape of the peripheral temperature control flow paths 60 will be described later with reference to FIG. 3.

In the opposite end portions (the left and right end portions in FIGS. 2A and 2B) of the central stage connecting portion 53 close to the central stage portions 51, inlet ports 67 and outlet ports 69 are provided in such a fashion that one pair of the inlet port 67 and the outlet port 69 is arranged in each end portion of the central stage connecting portion 53. Through the inlet ports 67, the coolant is introduced into central temperature control flow paths 65 provided within the central stage member 50 (within the central stage portions 51). Through the outlet ports 69, the coolant is discharged from the central temperature control flow paths 65. The configuration and shape of the central temperature control flow paths 65 will be described later with reference to FIG. 4.

In the middle area of the central stage connecting portion 53, three hole portions 57 (denoted by 57a, 57b and 57c in the order of the rear, middle and front ones in FIG. 2A) are provided in such positions in which the hole portions 57 overlap with the temperature control medium inlet port 61 and the temperature control medium outlet ports 63 when the peripheral stage member 40 and the central stage member 50 are superimposed to make up the substrate stage 20 as shown in FIG. 2B.

As can be seen in FIG. 2A, pipes are provided in the support base 55 in such positions corresponding to the temperature control medium inlet port 61, the temperature control medium outlet ports 63, the inlet ports 67, and the outlet ports 69. When the peripheral stage member 40 and the central stage member 50 are superimposed to make up the substrate stage 20, the pipes are respectively connected to the ports 61, 63, 67 and 69. In FIG. 2A, the pipe corresponding to the temperature control medium inlet port 61 is denoted by reference numeral 61', the pipes corresponding to the temperature control medium outlet ports 63 are denoted by reference numeral 63', the pipes corresponding to the inlet ports 67 are denoted by reference numeral 67', and the pipes corresponding to the inlet ports 69 are denoted by reference numeral 69'. The connection of the temperature control medium inlet port 61 and the pipe 61' and the connection of the temperature control medium outlet ports 63 and the pipes 63' are accomplished in the hole portions 57 (57a, 57b and 57c). Thus, the pipes 61' and 63' are arranged to protrude higher than other portions on the top surface of the support base 55 by a height substantially equal to the height of the hole portions 57 (namely, the thickness of the central stage connecting portion 53).

Figure 3:
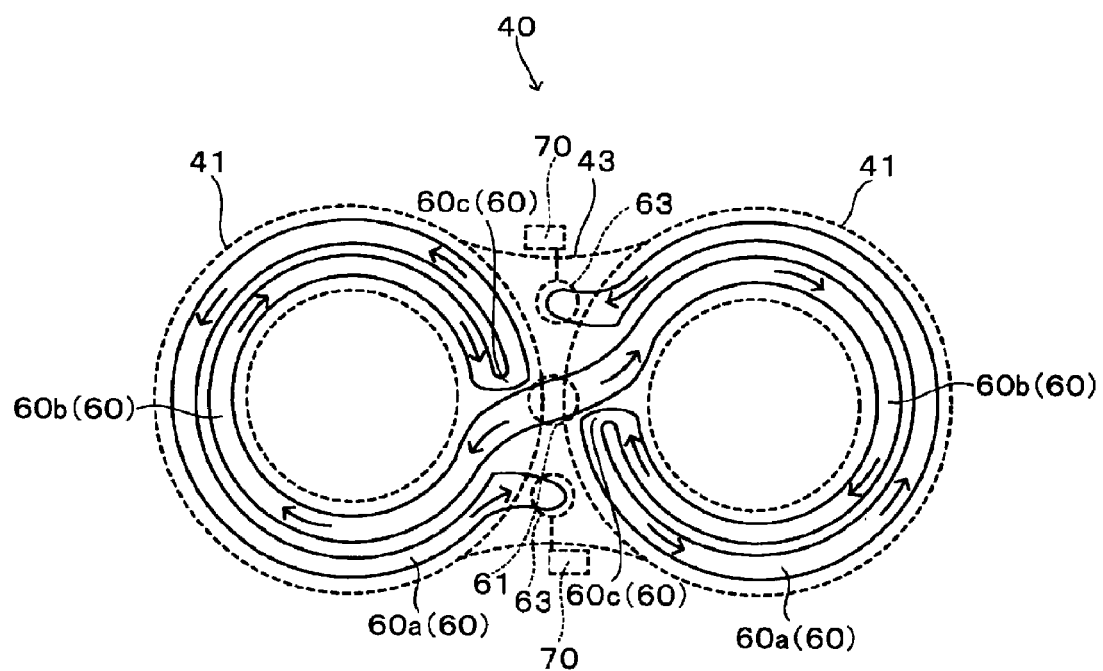
FIG. 3 is a schematic horizontal section view showing the peripheral stage member.

As set forth above, the peripheral temperature control flow paths 60 are respectively formed within the two peripheral stage portions 41. FIG. 3 is a schematic horizontal section view showing the peripheral stage member 40. In FIG. 3, the peripheral stage member 40 is indicated by broken lines for the sake of description. As shown in FIG. 3, the peripheral temperature control flow paths 60 are connected to the temperature control medium inlet port 61 and the temperature control medium outlet ports 63 of the peripheral stage connecting portion 43. The coolant, e.g., cooling water, introduced from the temperature control medium inlet port 61 is moved through the peripheral temperature control flow paths 60 and then discharged from the temperature control medium outlet ports 63. Each of the peripheral temperature control flow paths 60 includes a peripheral outer flow path 60a extending along the outer area of each of the peripheral stage portions 41 (along the peripheral portion of each of the substrates W), a peripheral inner flow path 60b extending along the inner area of each of the peripheral stage portions 41, and a connection flow path 60c for interconnecting one end portion of the peripheral outer flow path 60a and one end portion of the peripheral inner flow path 60b. The other end of the peripheral outer flow path 60a (namely, the end portion of the peripheral outer flow path 60a not connected to the connection flow path 60c) is connected to each of the temperature control medium outlet ports 63. The other end of the peripheral inner flow path 60b (namely, the end portion of the peripheral inner flow path 60b not connected to the connection flow path 60c) is connected to the temperature control medium inlet port 61. In this regard, the peripheral outer flow path 60a and the peripheral inner flow path 60b extend to substantially go around the peripheral stage member 40, respectively. The connection flow path 60c and the temperature control medium outlet ports 63 are arranged so as to be adjacent to the temperature control medium inlet port 61 to interpose the temperature control medium inlet port 61 therebetween.

In the present embodiment, the peripheral stage member 40 includes two peripheral stage portions 41 and one peripheral stage connecting portion 43 for coupling the two peripheral stage portions 41. As shown in FIG. 3, the peripheral temperature control flow paths 60 are respectively formed in the two peripheral stage portions 41, and are connected to one common temperature control medium inlet port 61. Thus, the coolant is introduced into the two peripheral temperature control flow paths 60 from the common temperature control medium inlet port 61. After passing through the peripheral temperature control flow paths 60, the coolant is discharged from the temperature control medium outlet ports 63 formed independently of each other. Flow control devices 70, each of these including a valve and a control unit, are respectively installed in the temperature control medium outlet ports 63. The flow control devices 70 control the flow rates of the coolant flowing through the peripheral temperature control flow paths 60. The flow control devices 70 installed in the two temperature control medium outlet ports 63, respectively, are controlled independently of each other. That is, the flow rates of the coolant flowing through the two peripheral temperature control flow paths 60 are controlled independently of each other.

Figure 4:
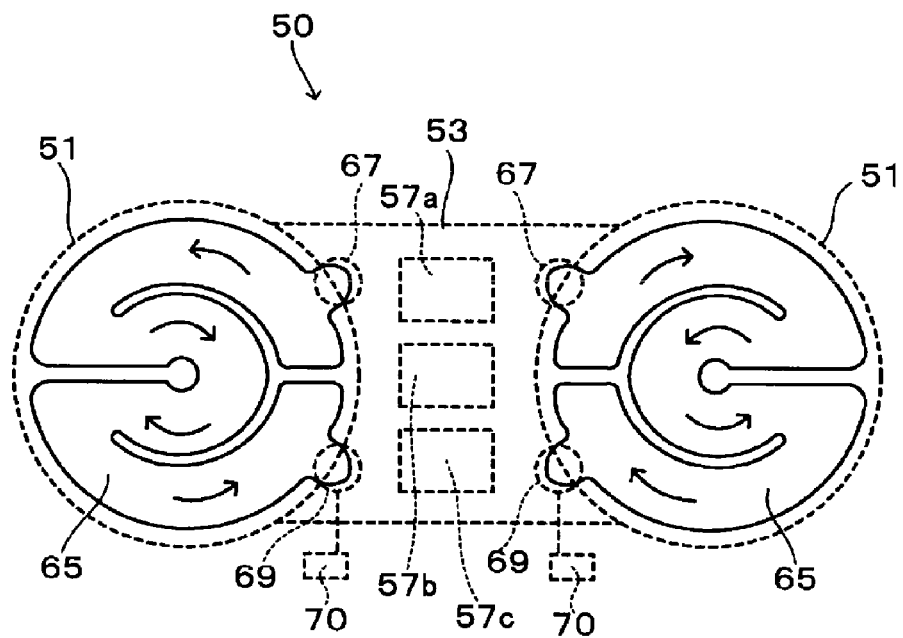
FIG. 4 is a schematic horizontal section view showing the central stage member.

The central temperature control flow paths 65 are respectively formed within the two central stage portions 51. FIG. 4 is a schematic horizontal section view showing the central stage member 50. In FIG. 4, the central stage member 50 is indicated by broken lines for the sake of description. As shown in FIG. 4, the central temperature control flow paths 65 are connected to the inlet ports 67 and the outlet ports 69 of the central stage connecting portion 53. The coolant introduced from the inlet ports 67 is moved through the central temperature control flow paths 65, and then discharged from the outlet ports 69. The central temperature control flow paths 65 need only to have a shape suitable for covering the entire surface of the central stage portions 51. In some embodiments, the shape of the central temperature control flow paths 65 may be configured such that two flow paths having a generally annular shape meander along the inner and outer areas of each of the central stage portions 51 as shown in FIG. 4. The flow control devices 70, each of these including a valve and a control unit, are respectively installed in the outlet ports 69 in the same manner as the temperature control medium outlet ports 63. The flow control devices 70 control the flow rates of the coolant flowing through the central temperature control flow paths 65. The flow control devices 70 installed in the two outlet ports 69 are controlled independently of each other. Thereby, the flow rates of the coolant flowing through the two central temperature control flow paths 65 are controlled independently of each other.

Referring again to FIG. 1, the peripheral temperature control flow paths 60 are in communication with a temperature control medium source 80 arranged outside the processing chamber 10, through an inlet pipe 83 and outlet pipes 84. Upon operating the temperature control medium source 80, the coolant is supplied from the temperature control medium inlet port 61 into the peripheral temperature control flow paths 60 through the inlet pipe 83. After passing through the peripheral temperature control flow paths 60, the coolant is discharged from the temperature control medium outlet ports 63 to the temperature control medium source 80 through the outlet pipes 84. In other words, the coolant circulates between the temperature control medium source 80 and the peripheral temperature control flow paths 60.

As shown in FIG. 1, the central temperature control flow paths 65 are in communication with a temperature control medium source 90 arranged outside the processing chamber 10, through inlet pipes 93 and outlet pipes 94. Upon operating the temperature control medium source 90, the coolant is supplied from the inlet ports 67 into the central temperature control flow paths 65 through the inlet pipes 93. After passing through the central temperature control flow paths 65, the coolant is discharged from the outlet ports 69 to the temperature control medium source 90 through the outlet pipes 94. That is, the coolant circulates between the temperature control medium source 90 and the central temperature control flow paths 65. The temperature control medium sources 80 and 90 differ from each other. The coolants circulating through the temperature control medium sources 80 and 90 have different temperatures. The temperatures of the coolants are independently controlled by the temperature control medium sources 80 and 90.

When substrate processing is performed in the substrate processing apparatus 1 configured as above, the substrates W mounted on the substrate stage 20 are temperature-controlled by the radiant heat radiating from the substrate stage 20 whose temperature is controlled by the temperature control flow paths (i.e., the peripheral temperature control flow paths 60 and the central temperature control flow paths 65) formed within the peripheral stage member 40 and the central stage member 50. At this time, the peripheral substrate portions W1 are temperature-controlled by the cooling capacity of the peripheral temperature control flow paths 60 formed within the peripheral stage member 40, and the central substrate portions W2 are cooled by the cooling capacity of the central temperature control flow paths 65 formed within the central stage member 50. In this manner, the peripheral substrate portions W1 and the central substrate portions W2 are cooled by the cooling capacities of different temperature control flow paths.

During the course of substrate processing, the substrates W are heated by the radiant heat radiating from the inner wall of the processing chamber 10 with higher temperature than that of the substrates W. In particular, the amount of heat inputted to the peripheral substrate portions W1 is greater than the amount of heat inputted to the central substrate portions W2 because the distance between the peripheral substrate portions W1 and the inner wall of the processing chamber 10 is shorter than the distance between the central substrate portions W2 and the inner wall of the processing chamber 10. Since the surface temperatures of the substrates W under processing need to be kept uniform during the course of substrate processing, it is necessary to cool (temperature-control) the peripheral substrate portions W1 more heavily than the central substrate portions W2. As mentioned above, the substrate stage 20 of the substrate processing apparatus 1 of the present embodiment includes the peripheral stage member 40 and the central stage member 50. The horizontal gap 56 and the vertical gap 59 are formed between the peripheral stage member 40 and the central stage member 50, respectively. The peripheral stage member 40 and the central stage member 50 are kept out of contact with each other. In this regard, the inside of the processing chamber 10 is vacuumed during the course of substrate processing. Therefore, the gaps 56 and 59 are vacuum-insulated to prevent mutual influence of the temperatures of the peripheral stage member 40 and the central stage member 50. This makes it possible to independently control the temperatures of the peripheral stage member 40 and the central stage member 50 so as to cool (temperature-control) the peripheral substrate portions W1 more heavily than the central substrate portions W2.

In other words, it becomes possible in some embodiments to independently manage and control the temperature and flow rate of the coolant flowing through the peripheral temperature control flow paths 60 formed within the peripheral stage member 40, and the temperature and flow rate of the coolant flowing through the central temperature control flow paths 65 formed within the central stage member 50, thereby independently and precisely managing and controlling the temperature of the peripheral substrate portions W1 cooled (temperature-controlled) by the peripheral temperature control flow paths 60 and the temperature of the central substrate portions W2 cooled (temperature-controlled) by the central temperature control flow paths 65. Accordingly, it is possible to precisely make uniform the overall surface temperatures of the substrates W during the course of substrate processing. For example, if the temperature of the peripheral substrate portions W1 grows higher than the temperature of the central substrate portions W2 due to the radiant heat radiating from the inner wall of the processing chamber 10, the temperature of the coolant flowing through the peripheral temperature control flow paths 60 is controlled to become lower than the temperature of the coolant flowing through the central temperature control flow paths 65. The flow rate of the coolant flowing through the peripheral temperature control flow paths 60 is controlled to become greater than the flow rate of the coolant flowing through the central temperature control flow paths 65. This makes it possible to cool (temperature-control) the peripheral substrate portions W1 more heavily than the central substrate portions W2, consequently making the overall surface temperatures of the substrates W uniform.

The substrate processing performed by the substrate processing apparatus 1 of the present embodiment may include, but is not particularly limited to, e.g., processing $SiO_2$ films formed on the surfaces of the substrates W by using a process gas such as a HF gas, a $NH_3$ gas, and then cleaning-processing the substrate by removing the $SiO_2$ films from the surfaces of the substrates W through heat treatment.

When simultaneously processing the two substrates W mounted on the substrate stage 20 of the present embodiment, the coolant is introduced from the temperature control medium source 80 into the two peripheral temperature control flow paths 60 through one common temperature control medium inlet port 61 and the flow rate of the coolant is controlled in the temperature control medium outlet ports 63 through which the coolant is discharged from the peripheral temperature control flow paths 60. As compared to when each of the two peripheral temperature control flow paths is provided with a temperature control medium inlet port and a temperature control medium outlet port, the above-described configuration in some embodiments helps simplify the piping arrangement for introduction of the coolant and assists in enhancing the space efficiency and reducing the cost.

While one example of the present embodiment has been described above, the present disclosure is not limited to the illustrated embodiment. It will be apparent to those skilled in the art that various kinds of modifications or changes may be made without departing from the scope of the present disclosure defined in the claims. These modifications or changes shall be construed to fall within the scope of the present disclosure. For example, the shapes of the peripheral temperature control flow paths 60 and the central temperature control flow paths 65 employed in the present embodiment are not limited to the ones shown in FIGS. 3 and 4. The peripheral temperature control flow paths 60 need only to have a shape suitable for uniformly controlling the temperatures of the entire surfaces of the peripheral stage portions 41. Likewise, the central temperature control flow paths 65 need only to have a shape suitable for uniformly controlling the temperatures of the entire surfaces of the central stage portions 51.

In the embodiment described above, the coolant such as cooling water is taken as an example of the temperature control medium flowing through the peripheral temperature control flow paths 60 and the central temperature control flow paths 65. However, the present disclosure shall not be limited thereto. For example, in order to precisely control the temperature of the substrates W, a fluid having a temperature substantially equal to the surface temperature of the substrates W may be used as the temperature control medium and be allowed to flow through the peripheral temperature control flow paths 60 and the central temperature control flow paths 65. In this case, a temperature control medium heated to a specified temperature flows through the peripheral temperature control flow paths 60 and the central temperature control flow paths 65.

In the embodiment described above, no particular limitation is imposed on the cross-sectional shapes of the peripheral temperature control flow paths 60 and the central temperature control flow paths 65. In order to efficiently transfer the heat of the coolant to the peripheral stage member 40 and the central stage member 50, in some embodiments the respective flow paths (the peripheral temperature control flow paths 60 and the central temperature control flow paths 65) have cross-sectional shapes suitable for increasing the contact area between the inner surface of the flow path and the coolant.

Figure 5:
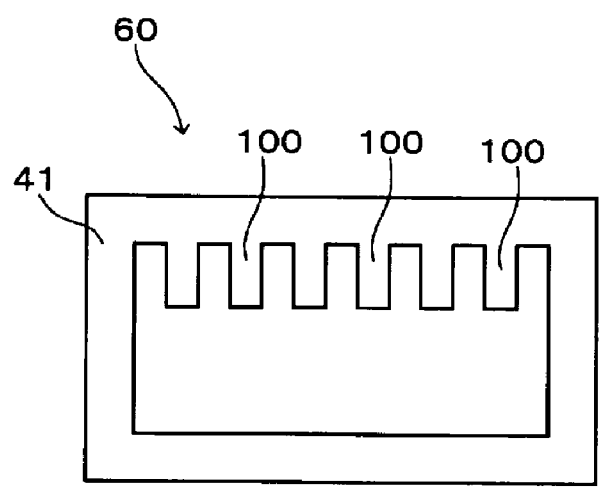
FIG. 5 is an explanatory view showing one example of a cross-sectional shape of a peripheral temperature control flow path.

FIG. 5 is an explanatory view showing one example of the cross-sectional shape of the peripheral temperature control flow paths 60. As shown in FIG. 5, each of the peripheral temperature control flow paths 60 according to the present modified example includes fins 100 vertically protruding from the ceiling surface of each of the peripheral temperature control flow paths 60. The length and width of the fins 100 is set such that the fins 100 do not impede the flow of the coolant flowing through the peripheral temperature control flow paths 60. In some embodiments, the length and width of the fins 100 are suitably set depending on the flow rate of the coolant flowing through the peripheral temperature control flow paths 60. In addition, the number of the fins 100 and the spacing between the fins 100 may be appropriately set depending on the flow rate of the coolant.

If the fins 100 are formed on the ceiling surface of each of the peripheral temperature control flow paths 60 as shown in FIG. 5, the area of the inner surface of each of the peripheral temperature control flow paths 60 becomes greater than the inner surface area of a typical flow path having a rectangular cross section. This leads to an increase in the contact area between the coolant flowing through the flow path and the inner surface of the flow path. Thus, the coolant can efficiently exchange heat with the inner surface of the flow path. In other words, the peripheral stage portions 41 (the peripheral stage member 40) are efficiently cooled (temperature-controlled) by the coolant flowing through the peripheral temperature control flow paths 60. As a result, it becomes possible to increase the cooling efficiency of the substrates W mounted on the peripheral stage member 40.

Figure 6:
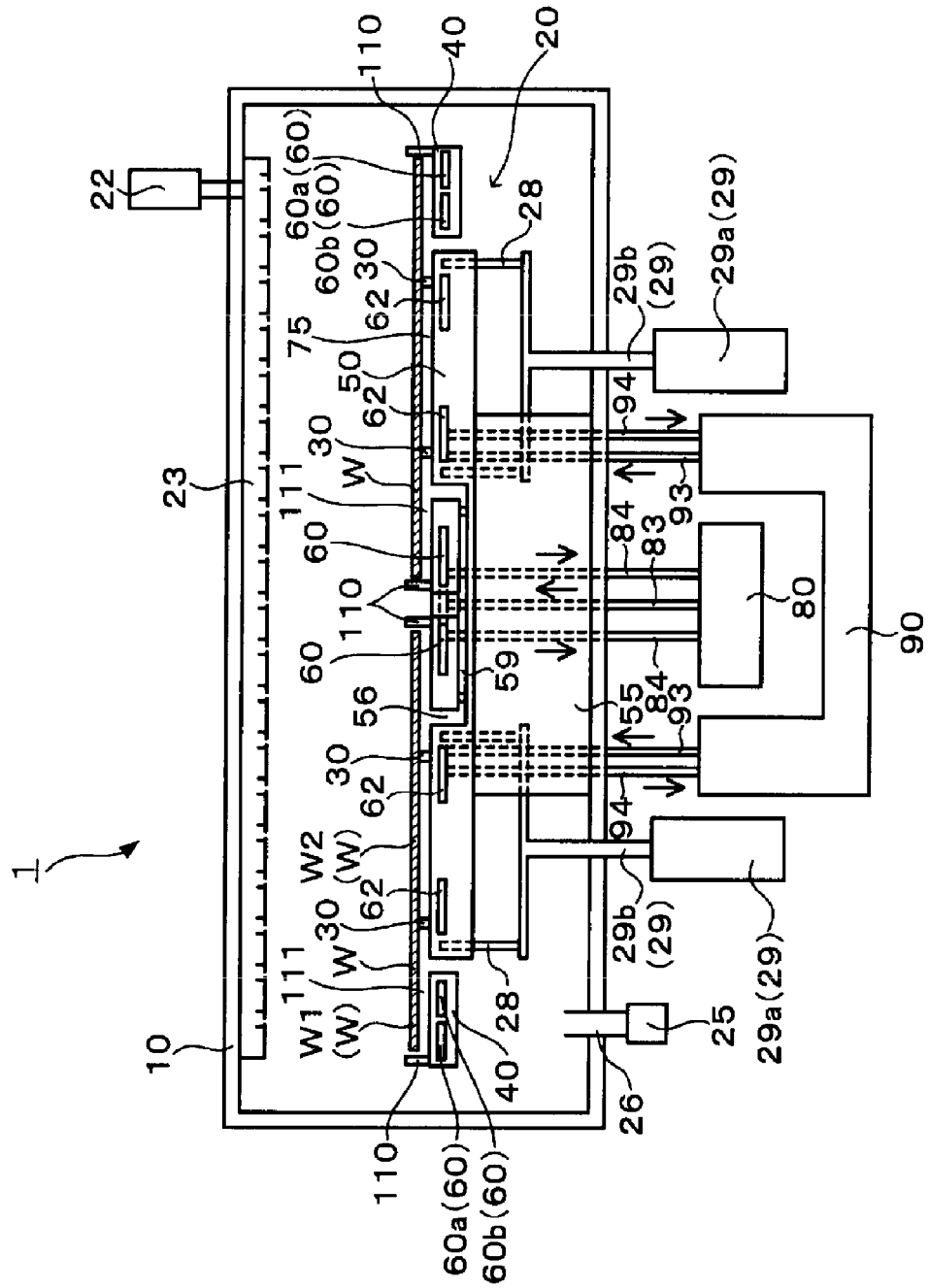
FIG. 6 is an explanatory view showing the substrate processing apparatus in which focus rings are arranged in peripheral stage portions.

In the substrate processing apparatus 1 of the embodiment described above, focus rings for aligning the substrates W in position may be provided in the outer edges of the peripheral stage portions 41. FIG. 6 is an explanatory view showing focus rings 110 provided in the outer edges of the two peripheral stage portions 41 in the substrate processing apparatus 1 of the embodiment described above. The focus rings 110 are annular rings arranged along the outer edges of the peripheral stage portions 41 (near the outer peripheries of the peripheral stage portions 41). The height of the focus rings 110 is substantially equal to the thickness of the substrates W.

As set forth above with respect to the illustrated embodiment, each of the substrates W is supported at three points by the projections 30 when it is mounted on the peripheral stage member 40 (on each of the peripheral stage portions 41). Although each of the substrates W is mounted in a specified position on the top surface of each of the peripheral stage portions 41, there is a possibility that each of the substrates W thus mounted may be displaced from the specified position due to any extrinsic cause (e.g., the vibration of the substrate processing apparatus). By providing the focus rings 110 in the outer edges of the peripheral stage portions 41 as shown in FIG. 6, it is possible to avoid any misalignment of each of the substrates W mounted in the specified position on the top surface of each of the peripheral stage portions 41. This makes it possible to align each of the substrates W in the specified position. When mounting the substrates W on the peripheral stage member 40, it is equally possible to align each of the substrates W in the specified position.

During the course of substrate processing, a process gas is introduced into the processing chamber 10. The focus rings 110 helps stabilize the flow of the process gas in the gaps 111 formed between the substrates W and the peripheral stage portions 41. Thus, substrate processing is performed in an efficient manner.

The present disclosure is applicable to a substrate stage, a substrate processing apparatus and a substrate processing system for use in a fine processing field, e.g., in a semiconductor manufacturing process.

According to the present disclosure, it is possible in some embodiments to provide a substrate processing apparatus capable of independently and precisely managing and controlling the temperatures of peripheral and central portions of a substrate with no mutual influence of the temperatures and capable of simplifying a piping arrangement.

While certain embodiments have been described, these embodiments have been presented by way of example only, and are not intended to limit the scope of the disclosures. Indeed, the novel apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing substrates within a vacuum processing space, the substrate processing apparatus comprising:
    a substrate stage for mounting at least two substrates thereon, the substrate stage including substrate stage units whose number corresponds to the number of the substrates mounted on the substrate stage and a connecting portion coupling the substrate stage units, each of the substrate stage units including a central temperature control flow path for controlling the temperature of a central portion of each of the substrates and a peripheral temperature control flow path for controlling the temperature of a peripheral portion of each of the substrates, the central temperature control flow path and the peripheral temperature control flow path being formed independently of each other, the connecting portion being provided with a temperature control medium inlet port for introducing therethrough a temperature control medium into the peripheral temperature control flow path, and the connecting portion being provided with temperature control medium outlet ports for discharging therethrough the temperature control medium from the peripheral temperature control flow path, the number of the temperature control medium outlet ports corresponding to the number of the substrates mounted on the substrate stage,
    wherein the peripheral temperature control flow path includes:
        a peripheral inner flow path connected at one end to the temperature control medium inlet port and arranged to extend along the peripheral portion of each of the substrates;
        a peripheral outer flow path connected at one end to each of the temperature control medium outlet ports and arranged to extend along the peripheral portion of each of the substrates; and
        a connection flow path arranged to interconnect the other end of the peripheral inner flow path and the other end of the peripheral outer flow path, the connection flow path and each of the temperature control medium outlet ports being arranged adjacent to the temperature control medium inlet port to interpose the temperature control medium inlet port therebetween.

2. The apparatus of claim 1, wherein the central temperature control flow path and the peripheral temperature control flow path are respectively connected to different temperature control medium sources.

3. The apparatus of claim 1, wherein the central temperature control flow path and the peripheral temperature control flow path each includes a ceiling surface and a fin protruding from the ceiling surface.

4. The apparatus of claim 1, wherein a flow control device is respectively provided in each of the temperature control medium outlet ports.

5. The apparatus of claim 4, wherein the flow control devices are controlled independently of each other.

6. The apparatus of claim 1, wherein the substrate stage units include:

a peripheral stage member configured to have mounted thereon the peripheral portion of each of the substrates to control the temperature of the peripheral portion; and a central stage member configured to have mounted thereon the central portion of each of the substrates to control the temperature of the central portion, wherein the substrate stage further includes a support base that supports the peripheral stage member and the central stage member, and wherein the peripheral temperature control flow path is formed within the peripheral stage member, the central temperature control flow path is formed within the central stage member, and the peripheral stage member and the central stage member are not in contact with each other with a gap left therebetween.

7. The apparatus of claim 6, wherein the peripheral stage member includes two or more annular peripheral stage portions and the central stage member includes two or more central stage portions having a shape corresponding to inner circumferences of the peripheral stage portions, wherein the connecting portion includes a peripheral stage connecting portion that couples the peripheral stage portions and a central stage connecting portion that couples the central stage portions, and wherein annular gaps are formed between the peripheral stage portions and the central stage portions in a horizontal direction, a gap is formed between the peripheral stage connecting portion and the central stage connecting portion in a vertical direction, and the peripheral stage connecting portion and the central stage connecting portion are coupled to the support base.

8. The apparatus of claim 7, wherein the temperature control medium inlet port and the temperature control medium outlet ports are provided in the peripheral stage connecting portion.

9. The apparatus of claim 1, wherein focus rings for aligning the substrates in position are provided in outer edges of the peripheral stage portions.

* * * * *